United States Patent
Guo et al.

(10) Patent No.: US 9,568,620 B2
(45) Date of Patent: Feb. 14, 2017

(54) SOLID STATE PHOTOMULTIPLIER

(71) Applicant: General Electric Company, Schenectady, NY (US)

(72) Inventors: JianJun Guo, Ballston Spa, NY (US); Sergei Ivanovich Dolinsky, Clifton Park, NY (US); David Leo McDaniel, Dousman, WI (US); Jonathan David Short, Saratoga Springs, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/851,518

(22) Filed: Sep. 11, 2015

(65) Prior Publication Data
US 2016/0084970 A1    Mar. 24, 2016

Related U.S. Application Data (60) Provisional application No. 62/053,487, filed on Sep. 22, 2014.

(51) Int. Cl.
  *G01T 1/24*  (2006.01)
  *H01L 31/107*  (2006.01)
  *H04N 5/32*  (2006.01)

(52) U.S. Cl.
  CPC .............. *G01T 1/248* (2013.01); *G01T 1/247* (2013.01); *G01T 1/249* (2013.01); *H01L 31/107* (2013.01); *H04N 5/32* (2013.01)

(58) Field of Classification Search
  CPC .......... G01T 1/248; G01T 1/247; G01T 1/249; H01L 31/107; H04N 5/32
  See application file for complete search history.

(56) References Cited

U.S. PATENT DOCUMENTS

| | | | |
|---|---|---|---|
| 7,262,402 B2 | 8/2007 | Niclass et al. | |
| 7,795,639 B2 | 9/2010 | Rothman | |
| 8,217,436 B2 | 7/2012 | Henderson et al. | |
| 8,355,117 B2 | 1/2013 | Niclass | |
| 8,384,038 B2 | 2/2013 | Guo et al. | |
| 8,471,293 B2 | 6/2013 | Sanfilippo et al. | |
| 9,224,769 B2 * | 12/2015 | Park .................. | H01L 27/14609 |
| 2008/0290259 A1 * | 11/2008 | Mathewson .............. | G01J 1/46 250/214 R |

(Continued)

FOREIGN PATENT DOCUMENTS

WO    2013034771 A3    3/2013

OTHER PUBLICATIONS

S. Isaak et al. "Fully Integrated Linear Single Photon Avalanche Diode (SPAD) Array with Parallel Readout Circuit in a Standard 180 nm CMOS Process," 2010 International Conference on Enabling Science and Nanotechnology (ESciNano), Dec. 1-3, 2010, 2 pages.

(Continued)

*Primary Examiner* — Christine Sung
(74) *Attorney, Agent, or Firm* — Robert M. McCarthy (57) ABSTRACT

Embodiments of a solid state photomultiplier are provided herein. In some embodiments, a photosensor may include a sensing element; and readout electronics, wherein the sensing element is AC coupled to the readout electronics. In some embodiments, a solid state photomultiplier may include a microcell having; a sensing element; and readout electronics, wherein the sensing element is AC coupled to the readout electronics.

18 Claims, 6 Drawing Sheets

(56) References Cited

U.S. PATENT DOCUMENTS

| | | | |
|---|---|---|---|
| 2011/0108702 A1* | 5/2011 | Jackson | H01L 27/1446 |
| | | | 250/207 |
| 2013/0056640 A1 | 3/2013 | Yvon et al. | |
| 2013/0313414 A1* | 11/2013 | Pavlov | H01L 31/0224 |
| | | | 250/214.1 |
| 2014/0175294 A1 | 6/2014 | Frach | |
| 2014/0191115 A1* | 7/2014 | Webster | H01L 31/107 |
| | | | 250/214 R |

OTHER PUBLICATIONS

Kim et al., "60GHz CMOS-APD Optoelectronic Mixers with Optimized Conversion Efficiency", IEEE Topical Meeting on Microwave Photonics, Piscataway, NJ, USA, pp. 139-142, Oct. 5, 2010.

Webster et al., "A Silicon Photomultiplier with >30% Detection Efficiency from 450-750nm and 11.6 μm pitch NMOS-only Pixel with 21.6% Fill Factor in 130nm CMOS", Proceedings of the European Solid-State Device Research Conference, pp. 238-241, Sep. 17, 2012.

PCT Search Report and Written Opinion issued in connection with corresponding PCT Application No. PCT/US2015/050443 on Dec. 18, 2015.

* cited by examiner

SOLID STATE PHOTOMULTIPLIER

CROSS REFERENCE TO RELATED APPLICATION

This patent application claims the benefit of priority, under 35 U.S.C. §119, of U.S. Provisional Patent Application Ser. No. 62/053487, filed Sep. 22, 2014, titled "SOLID STATE PHOTOMULTIPLIER" the entire disclosure of which is incorporated herein by reference.

BACKGROUND

The subject matter disclosed herein generally relates to detectors for use in imaging systems, such as X-ray, nuclear medicine imaging systems, combinations thereof, or the like.

Conventional imagining technologies generally include one or more detectors configured to convert incident radiation to useful electrical signals that can be used in image formation. Such detectors may employ solid state photomultipliers (e.g., silicon photomultipliers (SiPM)), which may be useful for detecting optical signals generated in a scintillator in response to the incident radiation. Typical mechanisms utilized to read out analog SSPM pixels may include either AC or DC coupling of the SSPM signal to external electronics. However, due to stray or parasitic capacitance along the signal path, the signal may be degraded, thereby causing the detector to suffer from crosstalk, signal integrity degradation and additional noise.

The inventors have observed that integrating the readout electronics with the SSPM on the same die may be one mechanism to reduce such crosstalk or signal noise, and preserve signal integrity. Such mechanisms typically including a photodiode (e.g., single-photon avalanche diode (SPAD) (fabricated in a high voltage well) on the same die as the readout electronics (fabricated in a low voltage well) and interfacing the SPAD and readout electronics to DC couple the signal generated by the SPAD to readout electronics. However, these configurations require the die to be specifically fabricated to facilitate isolation between the SPAD and the electronics. Moreover, such configurations may still suffer crosstalk between the high voltage components (SPAD) and low voltage components (readout electronics).

Thus, the inventers have provided an improved solid state photomultiplier.

BRIEF DESCRIPTION OF THE INVENTION

Embodiments of a solid state photomultiplier are provided herein. In some embodiments, a photosensor may include a sensing element; and readout electronics, wherein the sensing element is AC coupled to the readout electronics.

In some embodiments, a solid state photomultiplier may include a microcell having; a sensing element; and readout electronics, wherein the sensing element is AC coupled to the readout electronics.

DETAILED DESCRIPTION

Embodiments of a solid state photomultiplier are disclosed herein. In at least some embodiments, the inventive solid state photomultiplier advantageously utilizes a low voltage well that isolates low voltage readout electronics (e.g. buffers, comparators, or the like.) from the high voltage components (e.g. photodiodes such as a single-photon avalanche diode (SPAD), or the like) to form a capacitor that facilitates an AC coupling of the signal generated by the high voltage components to the readout electronics. Furthermore, this mechanism may further advantageously be extended to allow the fabrication of on-chip capacitors for AC coupling the high voltage signal to off-chip readout electronics.

Embodiments discussed herein relate to a detector in a nuclear imaging system, such as a positron emission tomography (PET) or single photon emission computed tomography (SPECT) imaging system or in a combined or hybrid imaging system including such PET or SPECT imaging functionality (e.g., a PET/MR, a PET/CT, or a SPECT/CT imaging system). It should be appreciated, however, that the present devices may also be employed in other types of imaging modalities or detectors used to detect radiation or nuclear particles, such as radiographic detectors used in X-ray based imaging modalities (e.g., fluoroscopy, mammography, computed tomography (CT), tomosynthesis, angiography, and so forth). However, to simplify explanation, and to facilitate discussion in the context of a concrete example, the present discussion will be provided in the context of a nuclear imaging system.

Figure 1:
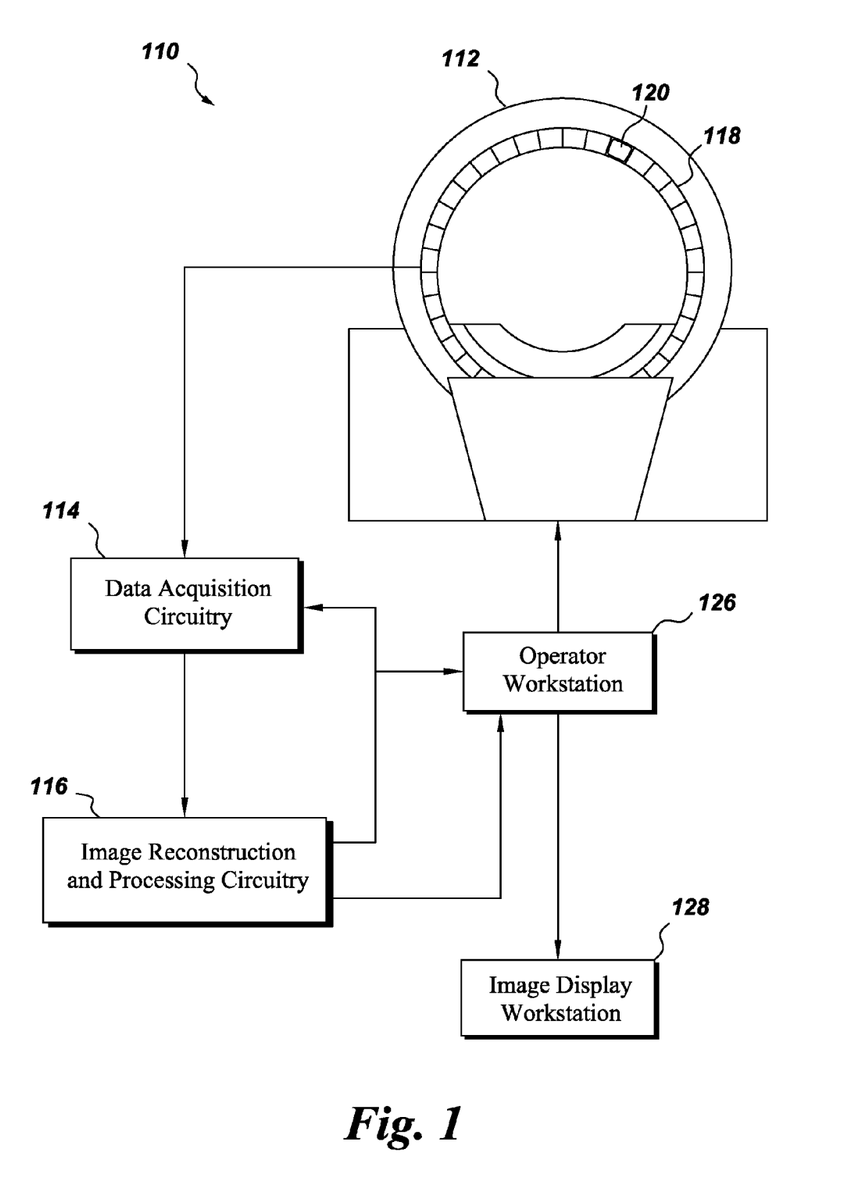
FIG. 1 is a diagrammatical representation of an exemplary PET imaging system in accordance with some aspects of the present invention.

FIG. 1 is a diagrammatical representation of an exemplary PET imaging system in accordance with some aspects of the present invention. Though a PET system 110 is described and discussed herein, it should be appreciated that the present approach may also be useful in other imaging contexts, such as in a SPECT or CT imaging system.

The depicted PET system 110 includes a detector assembly 112, data acquisition circuitry 114, and image reconstruction and processing circuitry 116. The detector assembly 112 of the PET system 110 typically includes a number of detector modules (generally designated by reference numeral 118) arranged about the imaging volume, as depicted in FIG. 1. As discussed herein the detector assembly 112, via the modules 118, may be configured to generate signals in response to gamma rays generated by positron annihilation events and emitted from a subject within the imaged volume. In certain implementations, the detector modules 118 can include scintillators and photon detection electronics. The detector assembly 112 may be of any suitable construction and configuration for acquiring PET data. For example, as in the depicted example, the detector assembly 112 can be configured as a full or partial ring.

In certain implementations, gamma rays may be converted, such as in a scintillator of the detector modules 118, to lower energy photons that in turn may be detected and converted in the detector modules 118 to electrical signals, which can be conditioned and processed to output digital signals. In certain imaging applications, to overcome the low number of optical photons generated in response to impinging radiation at the scintillator (i.e., the low signal level), a solid state photomultiplier or silicon photomultiplier (SiPM) may be combined with a scintillator to provide amplification of the signals.

The signals generated by the detector modules 118 can be used to match pairs of gamma ray detections as potential coincidence events. That is, in such a PET implementation, when two gamma rays strike opposing detectors it may be determined that a positron annihilation occurred somewhere on the line connecting the two impact locations (absent the effects of interactions of randoms and scatter detections). In SPECT implementations, line of flight information may instead be inferred based at least in part on the collimation associated with the detector assembly. The collected data can be sorted and integrated and used in subsequent processing such as by image reconstruction and processing circuitry 116.

Thus, in operation, the detector acquisition circuitry 114 is used to read out the signals from the detector modules 118 of the detector assembly 112, where the signals are generated in response to gamma rays emitted within the imaged volume. The signals acquired by the detector acquisition circuitry 114 are provided to the image reconstruction and processing circuitry 116. The image reconstruction and processing circuitry 116 generates an image based on the derived gamma ray emission locations. The operator workstation 126 is utilized by a system operator to provide control instructions to some or all of the described components and for configuring the various operating parameters that aid in data acquisition and image generation. The operating workstation 126 may also display the generated image. Alternatively, the generated image may be displayed at a remote viewing workstation, such as the image display workstation 128.

It should be appreciated that, to facilitate explanation and discussion of the operation of the PET system 110, the detector acquisition circuitry 114 and the image reconstruction and processing circuitry 116 have been shown separately in FIG. 1 from other illustrated components (e.g., the detector assembly 112, the operator workstation 126, and the image display workstation 128). However, it should be appreciated that, in certain implementations, some or all of these circuitries may be provided as part of the detector assembly 112, the operator workstation 126, and/or the image display workstation 128. For example, the hardware, software, and/or firmware executed on or provided as part of the data acquisition circuitry 114, whether provided as part of the detector assembly 112, the operator workstation 126, and/or the image display workstation 128, may be used to perform various detector readout and/or control actions described herein. In certain implementations the data acquisition circuitry 114 may include specially configured or programmed hardware, memory, or processors (e.g., application-specific integrated circuits (ASICs)) for performing detector readout steps as discussed herein. Similarly, certain of these readout functions may be performed using one or more general or special purpose processors and stored code or algorithms configured to execute on such processors. Likewise, a combination of special purpose hardware and/or circuitry may be used in conjunction with one or more processors configured to execute stored code to implement the steps discussed herein.

With the preceding in mind, the detector technology in one implementation of a system such as that depicted in FIG. 1 will be discussed in greater detail. In particular, a PET or SPECT system may comprise a photosensor 120 that utilizes arrays of solid-state photo multiplier devices as part of the gamma ray detection mechanism, such as within detector modules 118. Solid state photomultipliers (SSPMs), which are also commonly referred to as MicroPixel Photon Counters (MPPC) or MicroPixel Avalanche Photodiodes (MAPD) have become popular for use as photosensors. Typically, SSPMs are implemented as Silicon Photomultipliers (SiPM). Such devices may take the form, in certain implementations, of an array of microcells (e.g., comprising passively quenched Geiger-mode avalanche photodiodes (APD)) for detecting impinging photons. In general, SSPM devices used for photon detection can provide information about certain parameters, such as the time of the impingement event, the energy associated with the event, and the position of the event within the detector. These parameters can be determined through processing algorithms applied to the output signals generated by the SSPM.

In some embodiments, a multichannel readout front-end application-specific integrated circuit (ASIC) may interface with an array of SSPMs in a PET (or SPECT) system. The ASIC may be provided as part of the data acquisition circuitry 114 of FIG. 1 and may be configured to provide information on the timing, energy, and location of events in each SSPM to a processing system (e.g., processing circuitry 116), as well as the ability to bias each SSPM.

Figure 2:
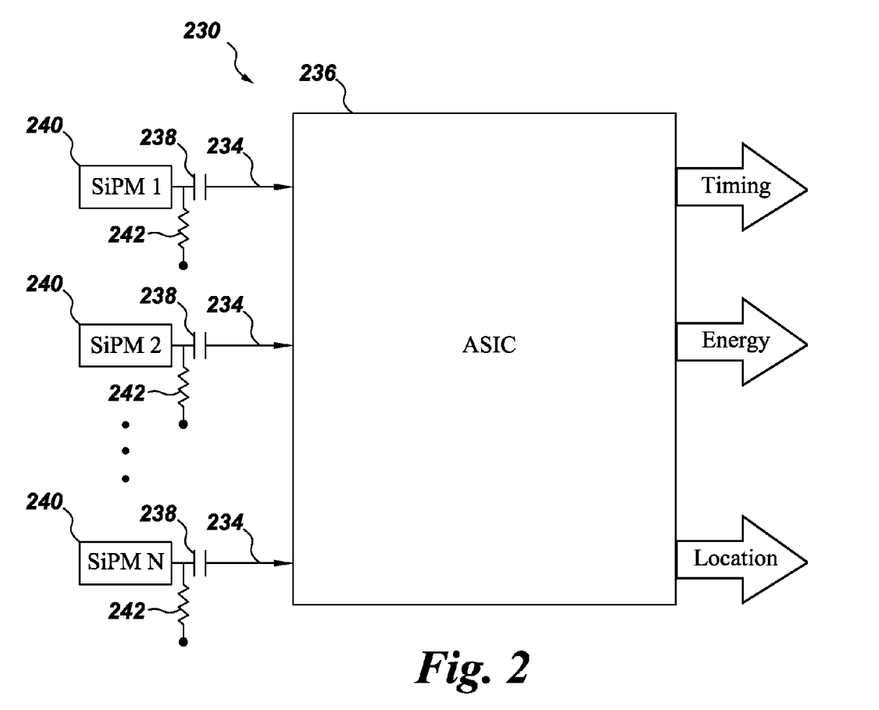
FIG. 2 is a block diagram of an exemplary conventional front-end readout electronics for a PET data acquisition system.

Turning to FIG. 2, a block diagram is depicted representing one example of a front-end readout electronics of a PET data acquisition system 230, such as may be used with the PET system 110 of FIG. 1. The PET data acquisition system 230 may include a plurality of pixels (SSPMs) 240 as well as multiple ASICs 236 as part of the detector modules (118 of FIG. 1) and/or data acquisition circuitry (114 of FIG. 1). Light generated in a scintillator in response to a gamma ray interaction is detected by a pixel and amplified. In this example, each SSPM 240 includes an anode output 234 in electrical communication with the ASIC 236 via a capacitor 238. That is, the outputs of the SSPMs 240 are the inputs to the respective ASIC 236. Each SSPM 240 may be further electrically coupled to a resistor 242.

The ASIC 236, in turn provides one or more of timing signals, energy signals, and/or position signals as outputs. Each of these signals output by the ASIC 236 corresponds to information obtained from the respective SSPMs 240 after processing by the ASIC 236. Although only three SSPMs 240 are shown in the figure, the PET data acquisition system 230 may comprise any number of SSPMs 240 suitable to facilitate a desired functionality of the PET data acquisition system 230. For example, in some embodiments, the front-end readout electronics of a data acquisition system 230 may include eighteen (18) SSPMs 240. However, in other implementations, other quantities of SSPMs 240 may be present within a data acquisition system 230.

The solid state photomultipliers 240 may be fabricated using any materials suitable to provide the desired functionality as described herein. For example, in some embodiments, each SSPM 240 may be formed using silicon as a semiconductor material, although other suitable semiconductor materials could instead be used (e.g. SiC, AlxGal-xAs, GaP, GaN and its alloys, amongst others).

Figure 3:
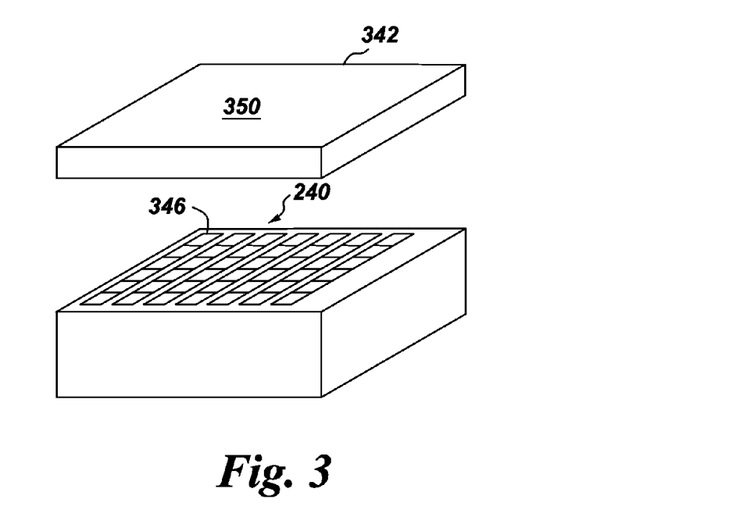
FIG. 3 depicts a perspective view of a detector element in accordance with some aspects of the present invention.

In some embodiments, each SSPM 240 may include a plurality of microscopic units, referred to as microcells. By way of illustration, a single SSPM 240 is shown in FIG. 3 to illustrate certain of the present concepts. The number of microcells 346 on a SSPM 240 is typically sufficient to provide effective dynamic range for the SSPM 240. The area of a SSPM 240 is sufficient to cover one or more crystal elements 350 formed on the scintillator 342. However, it should be appreciated that the exact number and density of the SSPMs 240 will be determined by detector module design to achieve the optimal performance and other known factors.

As depicted in FIG. 3, a single SSPM 240 pixel is comprised of a plurality of microcells 346 that amplify single optical photon arrivals from the scintillator 342 into an output signal, wherein each microcell 346 comprises one or more APDs. Typically, each SSPM 240 will contain a large number of microcells 346 (e.g., thereby providing between 100 to 2,500 APDs per $mm^2$) In some embodiments, each of the microcells 346 may have a length of between 20 microns to 100 microns. In one implementation, each of the microcells 346 may operate as an individual Geiger-mode APD a few volts above a breakdown voltage, with each microcell 346 being virtually identical to all the other microcells. In this mode of operation, an electron or hole generated by the absorption of an optical photon initiates an avalanche breakdown that is confined to an individual microcell 346 when the one or more photons are absorbed by that microcell 346.

In some embodiments, each microcell 346 functions independently of the others to detect photons. In such embodiments, a single discrete unit of electrical charge is emitted from the microcell 346 independent of the number of photons absorbed therein. That is, for each Geiger breakdown, the output signal of the microcell 346 will have substantially the same shape and charge. In some embodiments, the microcells are electrically connected in parallel to yield an integrated current over some area over which the signals are being aggregated, such as a SSPM 240. The summed discharge currents of the microcells 346 are indicative of the incidence of radiation over a given area. This quasi-analog output is capable of providing magnitude information regarding the incident photon flux over the area for which signals are being aggregated.

Figure 4:
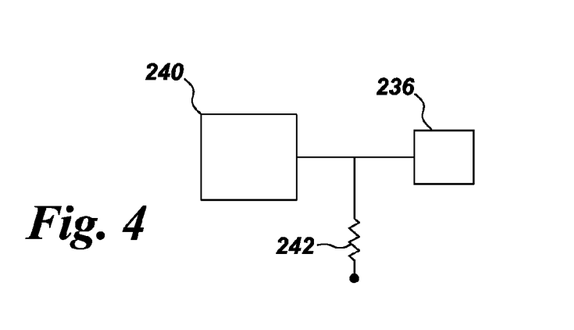
FIG. 4 is a schematical view of an exemplary front-end readout electronics for a PET data acquisition system in accordance with some aspects of the present invention.

Conventional SSPM array configurations typically include coupling each pixel (SSPM 240 of FIG. 2) to the ASIC/readout electronics (ASIC 236) via either AC or DC coupling of the SSPM signal to external electronics (shown schematically in FIG. 4). However, the inventors have observed that due to a parasitic capacitance along the signal path, the signal may be degraded, thereby causing the detector to suffer from cross talk and additional noise. Integrating readout electronics with the SSPM on the same die may be one mechanism to reduce such crosstalk or signal noise. Such mechanisms typically include interfacing a SPAD (fabricated in high voltage well) on the same die to DC couple the signal generated by SPAD to readout electronics (fabricated in low voltage well). However, these configurations require special isolation between the SPAD and the electronics, and still suffer crosstalk between the high voltage components and low voltage components.

As such, as discussed below, in some embodiments, the inventive solid state photomultiplier advantageously utilizes an isolation well (described below to isolate the low voltage components (e.g. readout electronics, buffers, comparators, etc.) from the high voltage components (e.g. SPAD (APD 502 discussed below)), and further, utilizes a capacitance formed by a structure of the isolation well to AC couple the high voltage components to the low voltage components. Such AC coupling may, for example, advantageously allow for a propagation of signal generated by the high voltage components (SPAD) to the low voltage components (readout electronics) while reducing or eliminating the increased noise, cross talk, or signal degradation discussed above.

Figure 5:
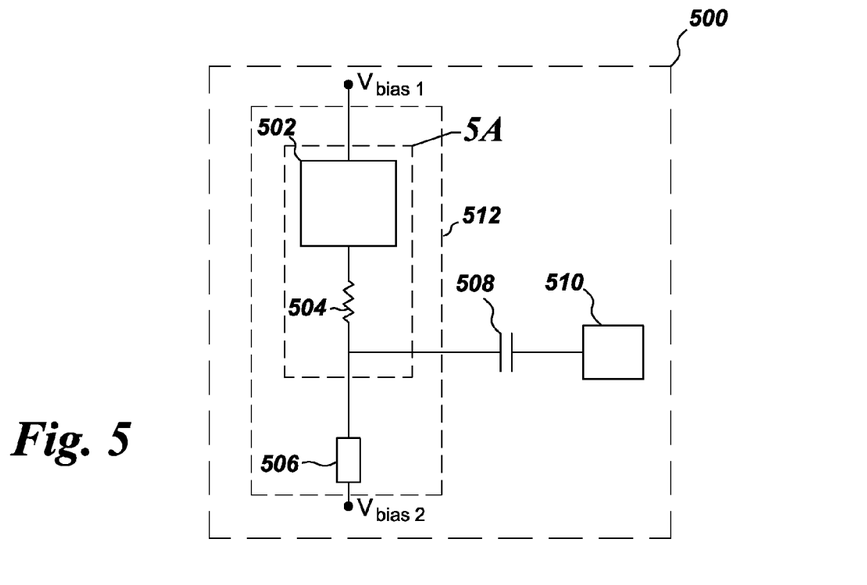
FIG. 5 is a block diagram of an exemplary microcell in accordance with some aspects of the present invention.
Figure 5A:
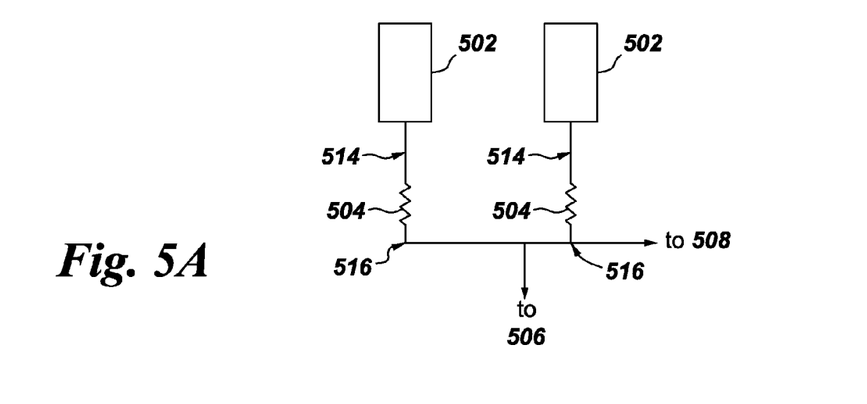
FIG. 5A is a portion of the block diagram shown in FIG. 5 in accordance with some aspects of the present invention.

One example of the above discussed capacitance is schematically shown in FIG. 5. In the depicted embodiment, the sensing element 512 of the microcell 500 comprises an avalanche photodiode (APD) 502 and at least one of impedance circuitry (e.g., a frequency dependent input impedance circuit) 506 and a resistor 504 coupled thereto. In such embodiments, the APD 502 is coupled to the readout electronics 510 via a capacitor 508 (e.g., the capacitor formed by the isolation well as described herein). The impedance circuitry 506 may include any passive or active components known in the art, for example, such as one or more resistors. Although shown as only having one APD 502, the microcell may be any number of APDs 502 suitable to provide a desired functionality of the microcell 500. For example, in some embodiments, the microcell 500 may include two or more, or an array, of APDs 502, such as the two APDs 502 shown in FIG. 5A. In such embodiments, each APD 502 may be respectively coupled to two or more resistors (one resistor 504 (quench resistor) coupled to each APD 502 shown). As shown in the figure, when present, the two or more resistors 504 may each be coupled to the APDs 502 at a first end 514 and to one another at a second end 516. In addition, the two or more resistors 504 may be further coupled to the readout electronics via the capacitor 508 and the impedance circuitry 506.

In some embodiments, the capacitance provided by the capacitor 508 may be obtained via relative placement of high voltage and low voltage elements (e.g., CMOS wells) on a single wafer during fabrication of the solid-state photo multiplier (e.g., SiPM). For example, referring to the cross sectional view of a portion of a solid state photomultiplier (SSPM) 600 in FIG. 6 and the top view of the portion of SSPM 600 in FIG. 7, in some embodiments, the SSPM 600 may comprise a substrate 602 and a first well (e.g., a high voltage well) 604 and second well (e.g., a low voltage well) 606 formed in the substrate 602. In such embodiments, the first well 604 may be coupled to the high voltage components of the SSPM 600 (e.g., APD or SPAD) and the second well 606 may be coupled to the low voltage components of the SSPM 600 (e.g., readout electronics). The substrate 602 may be any type of substrate suitable for the fabrication of a SSPM 600, for example, such as a silicon based substrate, or the like. In addition, the substrate 602 may be doped to form a p-type or n-type material (p-type shown in FIGS. 6 and 7).

Figures 6, 7:
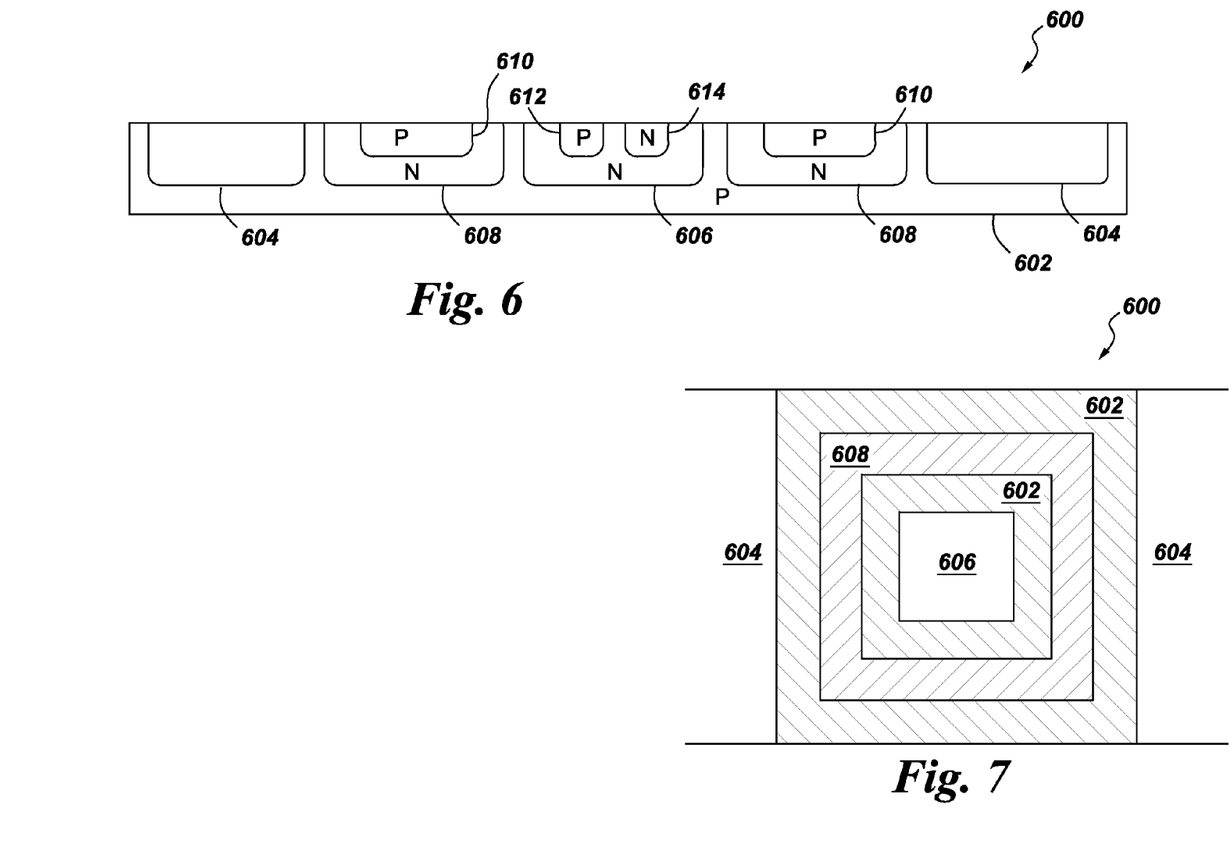
FIG. 6 depicts a cross sectional view of a portion of a solid state photomultiplier in accordance with some embodiments of the present invention.
FIG. 7 depicts a top down view of the portion of a solid state photomultiplier shown in FIG. 6 in accordance with some embodiments of the present invention.

The second well 606 may be doped to form either a p-type or n-type well (n-type well shown in FIGS. 6 and 7). In some embodiments, one or more nested wells (one p-type nested well 612 and one n-type nested well 614) may be formed within the second well 606.

In some embodiments, an isolation well 608 may be disposed between the first well 604 and second well 606. In such embodiments, the isolation well 608 may be doped to form either a p-type or n-type well (n-type well shown in FIGS. 6 and 7). Formed within the isolation well 608 are one or more nested wells having a type opposite the type of the isolation well 608, for example, such as the p-type nested well 610 shown in FIGS. 6 and 7. The inventors have observed that the isolation well 608 and nested well 610 structure provides the capacitance to AC couple the high voltage components in the high voltage well 604 to the low voltage components (in the low voltage well 606) as described above.

Figures 8, 9:
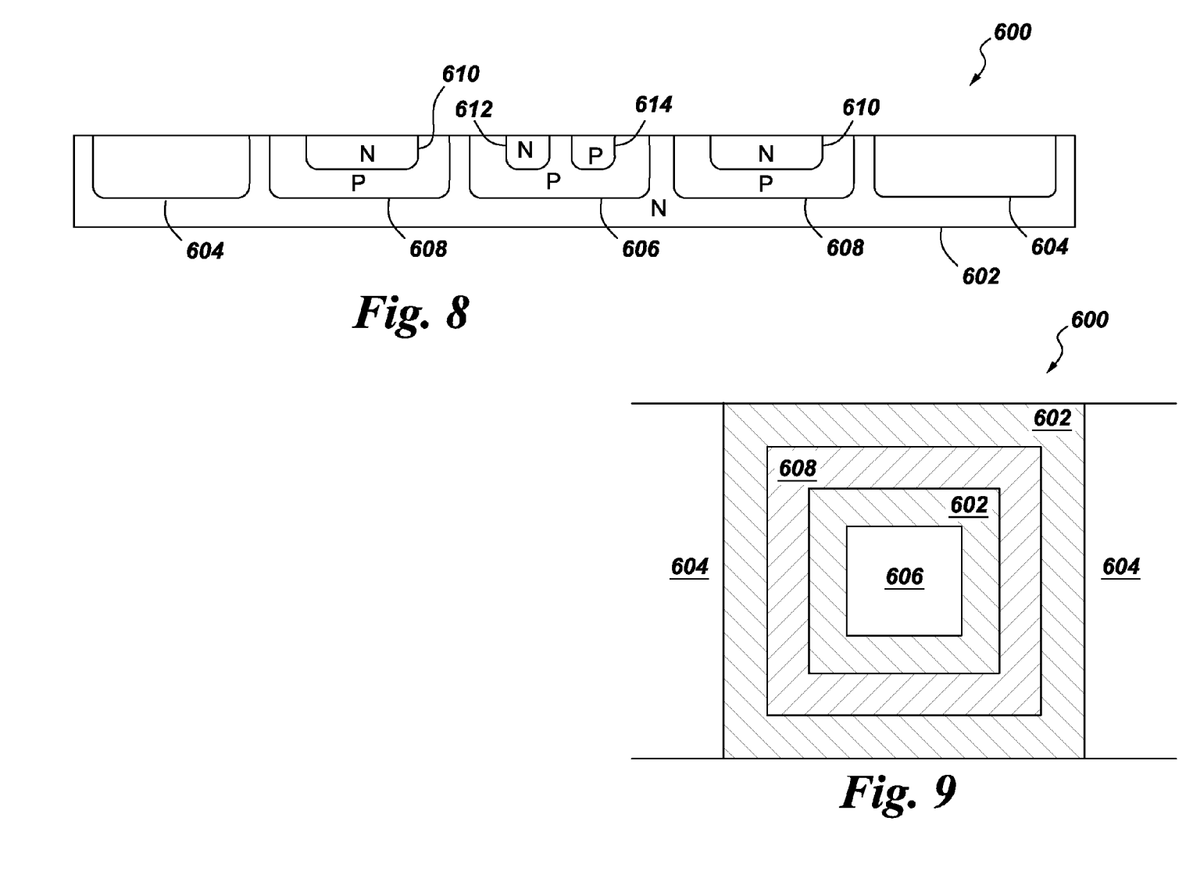
FIG. 8 depicts a cross sectional view of a portion of a solid state photomultiplier in accordance with some embodiments of the present invention.
FIG. 9 depicts a top down view of the portion of a solid state photomultiplier shown in FIG. 8 in accordance with some embodiments of the present invention.

Although the substrate 602, first well 604, second well 606 and isolation well 608 and respective nested wells are shown in FIGS. 6 and 7 as being of a certain type (e.g., p-type or n-type), it is to be understood that the wells may be of any type suitable to facilitate the operation of the SSPM 600 as described herein. For example, the cross sectional view of a portion of a solid state photomultiplier (SSPM) 600 in FIG. 8 and the top view of the portion of SSPM 600 in FIG. 9 depict each of the components of the SSPM 600 having an opposing type as compared to FIGS. 6 and 7.

While one configuration of the solid state photomultiplier 600 is shown in FIG. 6, it is to be understood that any configuration/placement of the high voltage well 604 relative to the low voltage well 606 suitable to provide the above described capacitance/coupling may be utilized. For example, in some embodiments, the low voltage well 606 may be disposed sufficiently close (e.g., as opposed to nested within, as shown in FIG. 6) to the high voltage well 604 to provide the desired capacitance/coupling. In such embodiments, the orientation or placement of each of the high voltage well 604 and low voltage well 606 may be optimized to offset a fringe electric field created by high voltage components (e.g., APD or SPAD) that would otherwise have an effect on other components (e.g., low voltage elements). Such a fringe electric field, or leakage effect thereof, may be determined utilizing one or more algorithms or software tools conventionally utilized for high voltage component design.

Figures 10, 11:
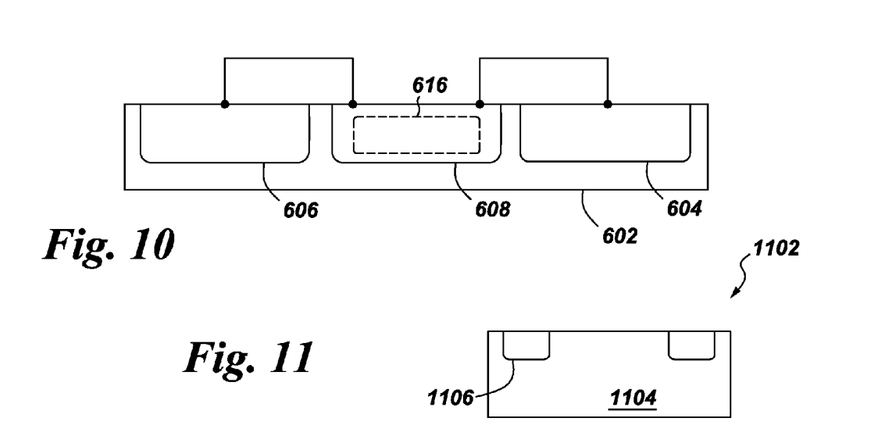
FIG. 10 depicts a cross sectional view of a portion of a solid state photomultiplier in accordance with some embodiments of the present invention.
FIG. 11 depicts a cross sectional view of a portion of a solid state photomultiplier in accordance with some embodiments of the present invention.

Although certain configurations of each of the wells to provide the desired capacitance and facilitate the AC coupling of the low voltage and high voltage components are shown, the capacitance may be acquired via any suitable means known in the art. For example, FIG. 10 shows a general depiction of the coupling of the high voltage well 606 and the low voltage well 604 via the isolation well 608 via a capacitor (shown in phantom at 616). Such coupling may be facilitated via any other suitable type of capacitor fabricated in the isolation well, for example such as a MOSFET gate capacitor, a conductor-insulator-conductor capacitor, or the like.

Figure 12:
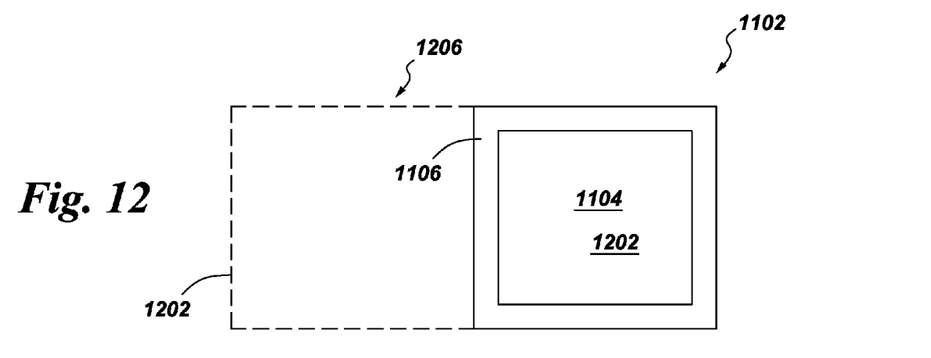
FIG. 12 depicts a top down view of a portion of a solid state photomultiplier in accordance with some embodiments of the present invention.
Figure 13:
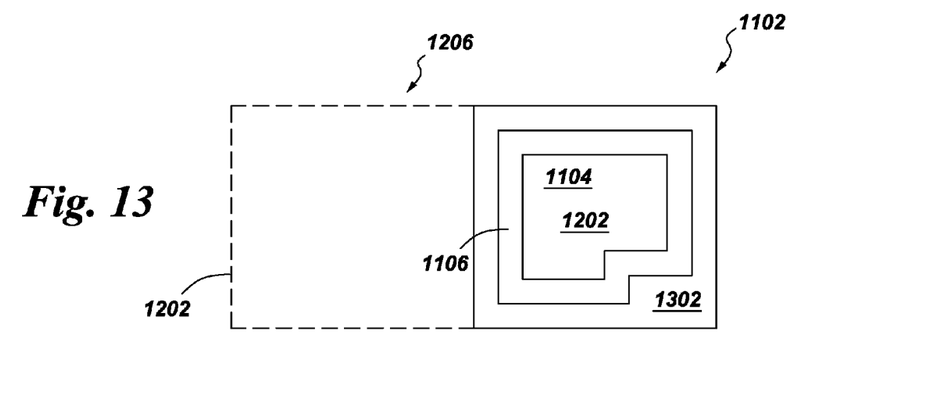
FIG. 13 depicts a top down view of a portion of a solid state photomultiplier in accordance with some embodiments of the present invention.

Although shown in certain configurations above, the low voltage and high voltage wells may be arranged in any manner suitable to provide the AC coupling as described herein. For example, an exemplary configuration of a portion of a microcell 1102 is depicted in FIGS. 11-12, where a low voltage well 1106 (e.g., low voltage well 606 described above) is shown nested within the high voltage well 1104 (e.g., high voltage well 604 described above). Referring to the top down views in FIGS. 12 and 13, in some embodiments, at least a portion of the low voltage well 1106 may be disposed about a periphery of the high voltage well 1104 and the APD 1202. In such embodiments, the outer periphery of the microcell 1102 may be configured to accommodate the readout electronics 1302, such as shown in FIG. 13. In some embodiments, multiple microcells (one additional microcell shown in phantom at 1202) may be disposed adjacent to the microcell 1102 to form an array 1206.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A microcell for a photosensor, comprising:
a sensing element; and
readout electronics, wherein the sensing element is AC coupled to the readout electronics via a capacitor, wherein the capacitor is formed by at least one low voltage well and at least one high voltage well, wherein the at least one low voltage well and the at least one high voltage well are formed within a substrate.

2. The microcell of claim 1, further comprising:
a plurality of photodiodes;
a plurality of quenching resistors each having a first end respectively coupled to the plurality of photodiodes and each having a second end electrically coupled to one another and electrically coupled to the readout electonics via the capacitor.

3. The microcell of claim 1, wherein the low voltage well is disposed within the high voltage well.

4. The microcell of claim 1, wherein at least a portion of the low voltage well is disposed about a periphery of the high voltage well.

5. The microcell of claim 1, wherein the capacitor is formed by an isolation well disposed between the at least one high voltage well and the at least one low voltage well.

6. The microcell of claim 5, wherein the isolation well comprises a nested well disposed within the isolation well, wherein the isolation well comprises one of a p-type dopant or an n-type dopant and wherein the nested well comprises one of a p-type dopant or an n-type dopant that is opposite that of the isolation well.

7. The microcell of claim 1, wherein the sensing element comprises an avalanche photodiode operating in Geiger mode above breakdown voltage.

8. The microcell of claim 1, wherein the sensing element comprises at least one of quench resistor and impedance circuitry.

9. The microcell of claim 8, wherein the impedance circuitry comprises at least one of passive and active elements.

10. A solid state photomultiplier, comprising:
a microcell having;
a sensing element; and readout electronics, wherein the sensing element is AC coupled to the readout electronics via a capacitor, wherein the capacitor is formed by at least one low voltage well and at least one high voltage well, wherein the at least one low voltage well and the at least one high voltage well are formed within a substrate.

11. The solid state photomultiplier of claim 10, wherein the microcell further comprises:
a plurality of photodiodes;
a plurality of quenching resistors each having a first end respectively coupled to the plurality of photodiodes and each having a second end electrically coupled to one another and electrically coupled to the readout electonics via the capacitor.

12. The solid state photomultiplier of claim 10, wherein the low voltage well is disposed within the high voltage well.

13. The solid state photomultiplier of claim 10, wherein at least a portion of the low voltage well is disposed about a periphery of the high voltage well.

14. The solid state photomultiplier of claim 10, wherein the capacitor is formed by an isolation well disposed between the at least one high voltage well and the at least one low voltage well.

15. The solid state photomultiplier of claim 14, wherein the isolation well comprises a nested well disposed within the isolation well, wherein the isolation well comprises one of a p-type dopant or an n-type dopant and wherein the nested well comprises one of a p-type dopant or an n-type dopant that is opposite that of the isolation well.

16. The solid state photomultiplier of claim 10, wherein the photodiode comprises an avalanche photodiode operating in Geiger mode above breakdown voltage.

17. The solid state photomultiplier of claim 10, wherein the sensing element comprises at least one of quench resistor and impedance circuitry.

18. The solid state photomultiplier of claim 17, wherein the impedance circuitry comprises at least one of passive and active elements.

* * * * *